(12) United States Patent
Ebata

(10) Patent No.: US 11,677,412 B2
(45) Date of Patent: Jun. 13, 2023

(54) SEMICONDUCTOR DEVICE

(71) Applicant: RENESAS ELECTRONICS CORPORATION, Tokyo (JP)

(72) Inventor: Tomohiko Ebata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/529,885

(22) Filed: Nov. 18, 2021

(65) Prior Publication Data

US 2022/0166443 A1 May 26, 2022

(30) Foreign Application Priority Data

Nov. 24, 2020 (JP) .............................. JP2020-194037

(51) Int. Cl.
*H03M 1/66* (2006.01)
*H03M 1/46* (2006.01)
*H03M 1/12* (2006.01)

(52) U.S. Cl.
CPC ........... *H03M 1/46* (2013.01); *H03M 1/1245* (2013.01)

(58) Field of Classification Search
CPC .............................. H03M 1/46; H03M 1/1245
USPC .................. 341/144, 120, 118, 161
See application file for complete search history.

(56) References Cited

U.S. PATENT DOCUMENTS

2005/0001747 A1* 1/2005 Kuyel ................. H03M 1/1038
341/118

OTHER PUBLICATIONS

Y. Shu et al., "An Oversampling SAR ADC With DAC Mismatch Error Shaping Achieving 105 dB SFDR and 101 dB SNDR Over 1 kHz BW in 55 nm CMOS", IEEE Journal of Solid-State Circuits, vol. 51, No. 12, Dec. 2016, pp. 2928-2940.
J. Liu et al., "Second-order DAC MES for SAR ADCs", Electronics Letters, vol. 53, No. 24, Nov. 23, 2017, pp. 1570-1572.
W. Huang et al., "An Amplifier-Less Calibration-Free SAR ADC Achieving > 100dB SNDR for Multi-Channel ECG Acquisition with 667mVpp Linear Input Range", 2019 Symposium on VLSI Circuits Digest of Technical Papers, pp. C70-C71.

* cited by examiner

*Primary Examiner* — Peguy Jean Pierre
(74) *Attorney, Agent, or Firm* — McDermott Will & Emery LLP

(57) ABSTRACT

A semiconductor device performs sequential comparison of an analog input signal and a reference voltage to digitally convert the analog input signal. The semiconductor device includes an upper DAC generating a high-voltage region of the reference voltage based on a predetermined code, a lower DAC generating a low-voltage region of the reference voltage based on the code, and an injection DAC having the same configuration as that of the lower DAC and adjusting the low-voltage region of the reference voltage.

7 Claims, 15 Drawing Sheets

SEMICONDUCTOR DEVICE

CROSS-REFERENCE TO RELATED APPLICATIONS

The present application claims priority from Japanese Patent Application No. 2020-194037 filed on Nov. 24, 2020, the content of which is hereby incorporated by reference to this application.

BACKGROUND

The present invention relates to a semiconductor device provided with an error shaping mechanism.

For example, Non-Patent Document 1 (Y.-S. Shu, "An oversampling SAR ADC with DAC mismatch error shaping achieving 105 dB SFDR and 101 dB SNDR over 1 kHz BW in 55 nm CMOS") discloses an ADC (Analog to Digital Converter) in which mismatch error shaping (MES) of reference errors of a lower DAC (Digital to Analog Converter) is performed by sequential comparison (SAR: Successive Application Register). Specifically, in Non-Patent Document 1, the reference errors of the lower DAC are excluded by first-order error shaping.

Non-Patent Document 2 (J. Liu, "Second-order DAC MES for SAR ADCs") discloses a technique of excluding reference errors of a lower DAC by second-order error shaping.

Non-Patent Document 3 (W.-H Huang, "An Amplifier-Less Calibration-Free SAR ADC Achieving, 100 dB SNDR for Multi-Channel ECG Acquisition with 667 mVpp Linear Input Range") discloses a configuration in which a reference voltage of 2 V is applied to an upper DAC and a reference voltage of 1.2 V is applied to a lower DAC in order to expand an input range. Errors of the reference voltage are eliminated by an error shaping mechanism.

SUMMARY

In order to homologize an input of a high voltage, for example, to supply a high-voltage reference to the upper DAC, a high-withstand-voltage transistor is used. However, since the high-withstand-voltage transistor has a slower response speed than that of a low-withstand-voltage transistor, so that a conversion speed thereof decreases, which brings a decrease in conversion accuracy.

The present invention has been made in view of the above, and one of its objects is to provide a semiconductor device having improved conversion accuracy when a plurality of DACs different in operating voltage are used.

A brief description of a typical one among the inventions disclosed in the present application is made as follows. Atypical semiconductor device performs sequential comparison of an analog input signal and a reference voltage to digitally convert the analog input signal. The semiconductor device has an upper DAC generating a high-voltage region of the reference voltage based on a predetermined code, a lower DAC generating a low-voltage region of the reference voltage based on the code, and an injection DAC having the same configuration as that of the lower DAC and adjusting the low-voltage region of the reference voltage.

An effect(s) obtained by the typical invention among the inventions disclosed in the present application is briefly described as follows: improvement of conversion accuracy becomes possible when a plurality of DACs different in operating voltage are used.

DETAILED DESCRIPTION

Figure 1:
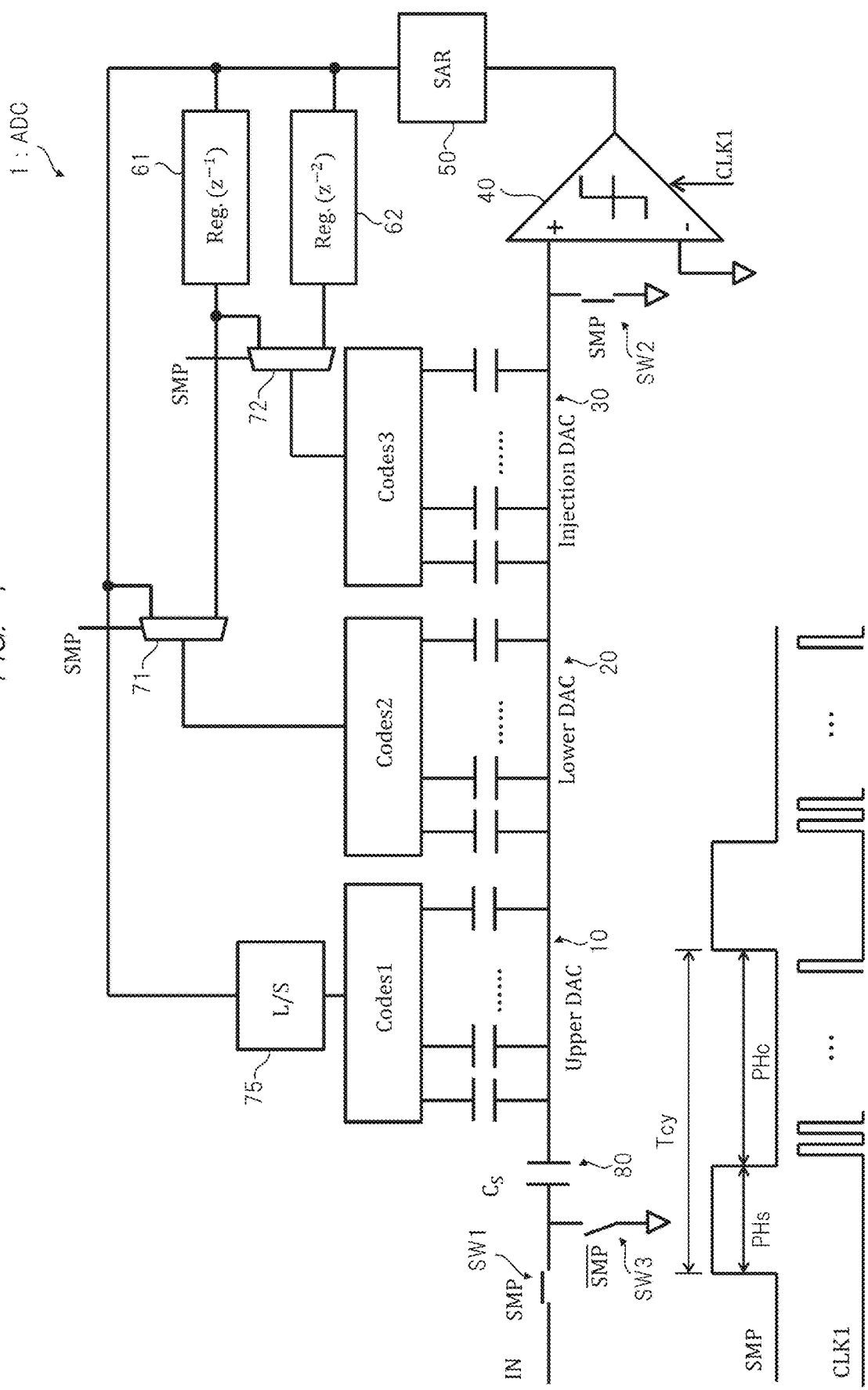
FIG. 1 is a configuration diagram showing an example of a semiconductor device according to a first embodiment of the present invention.

Hereinafter, embodiments of the present invention will be described in detail with reference to the accompanying drawings. Note that components having the same function are denoted by the same reference characters throughout the drawings for describing the embodiments, and a repetitive description thereof will be omitted.

First Embodiment (Configuration of Semiconductor Device)

FIG. 1 is a configuration diagram showing an example of a semiconductor device according to a first embodiment of the present invention. An analog-to-digital converter (hereinafter, also referred to as "ADC") 1 is a semiconductor device that digitally converts an inputted analog signal and outputs a digitally converted digital signal (hereinafter, also referred to as a digital code). As shown in FIG. 1, the analog-to-digital converter (semiconductor device) 1 includes an upper DAC (Digital to Analog Converter) 10, a lower DAC 20, an injection DAC 30, a comparator 40, a sequential comparison processing unit 50, MES registers 61 and 62, selectors 71 and 72, a level shifter 75, sampling capacity 80, switch circuits SW1, SW2, and SW3, and the like. Incidentally, hereinafter, the analog-to-digital converter may be referred to as an ADC.

The sampling capacity 80 is a circuit that holds (retains) an analog input signal inputted to the ADC. At a time of a sampling phase, for example, when a sampling signal SMP becomes active (for example, high level), the switch circuits SW1 and SW2 are turned on and the switch circuit SW3 is turned off and the analog input signal is held in the sampling capacity 80. Meanwhile, at a time of a comparison phase, for example, when the sampling signal SMP becomes inactive (for example, low level), the switch circuit SW3 is turned on and the switch circuits SW1 and SW2 are turned off and the analog input signal held in the sampling capacity 80 is supplied to the comparator 40.

The upper DAC 10, the lower DAC 20, and the injection DAC 30 are digital-to-analog converters that generate an analog signal based on a digital code (s) inputted from the sequential comparison processing unit 50 and the MES registers 61 and 62. Specifically, the upper DAC 10, the lower DAC 20, and the injection DAC 30 generate a reference voltage for comparison with the analog input signal inputted to the ADC 1.

The upper DAC 10 generates a voltage based on information of a high-order bit of the digital code. The lower DAC 20 and the injection DAC 30 generate voltages based on information of a low-order bit of the digital code. The injection DAC 30 has the same configuration as that of the lower DAC 20. The injection DAC 30 can adjust a voltage value of the reference voltage in more detail in cooperation with the lower DAC 20. The upper DAC 10 operates with a high-voltage (for example, 3 V) reference. The lower DAC 20 and the injection DAC 30 operate at a constant voltage (for example, 1 V).

The comparator 40 is a circuit that compares an analog input signal with a reference voltage. The comparator 40 is a circuit that operates at a high voltage (for example, 3 V). For example, the comparator 40 compares the analog input signal with the reference voltage for each sampling cycle Tcy, and outputs a comparison result(s) to the sequential comparison processing unit 50.

As shown in FIG. 1, the sequential comparison processing unit performs a sequential comparison processing based on the comparison result outputted from the comparator 40 to perform digital conversion of the analog input signal and generate a digital code which is an output signal. The sequential comparison processing unit 50 outputs the generated digital code to, for example, the upper DAC 10, the lower DAC 20, a circuit in a subsequent stage (not shown), or the like. Further, the sequential comparison processing unit 50 holds the generated digital code in the MES registers 61 and 62.

The MES registers 61 and 62 are storage devices that hold the digital code generated by the sequential comparison processing unit 50. The MES registers 61 and 62 hold each of a digital code generated in a one-previous sampling cycle Tcy and a digital code generated in a two-previous sampling cycle Tcy. Here, it is assumed that the MES register 61 holds the digital code generated in the one-previous sampling cycle Tcy and the MES register 62 holds the digital code generated in the two-previous sampling cycle Tcy.

Therefore, when a digital code of a current (present) sampling cycle Tcy is generated, the digital code of the two-previous sampling cycle Tcy held in the MES register 62 is erased and the digital code of the current sampling cycle Tcy is held (retained). At that time, the digital code of the one-previous sampling cycle Tcy held in the MES register 61 is moved to the MES register 62, and the digital code currently generated is held in the MES register 61. Incidentally, the MES registers 61 and 62 may hold only the low-order bits of the corresponding digital code. Incidentally, the MES register 62 may hold an inverted code obtained by inverting the corresponding digital code or an inverted code of the low-order bit.

The selector 71 is a circuit that switches the digital code supplied to the lower DAC 20 based on the sampling signal SMP. An input side of the selector 71 is connected to the sequential comparison processing unit 50 and the MES register 61. An output side of the selector 71 is connected to the lower DAC 20.

The selector 72 is a circuit that switches the digital code supplied to the injection DAC 30 based on the sampling signal SMP. An input side of the selector 72 is connected to the MES registers 61 and 62. An output side of the selector 72 is connected to the injection DAC 30.

The level shifter 75 is a circuit that converts a voltage of the digital code supplied to the upper DAC 10 into a high voltage and supplies the high-voltage digital code. An input side of the level shifter 75 is connected to the sequential comparison processing unit 50. An output side of the level shifter 75 is connected to the upper DAC 10.

(A/D Conversion Processing)

Figure 2:
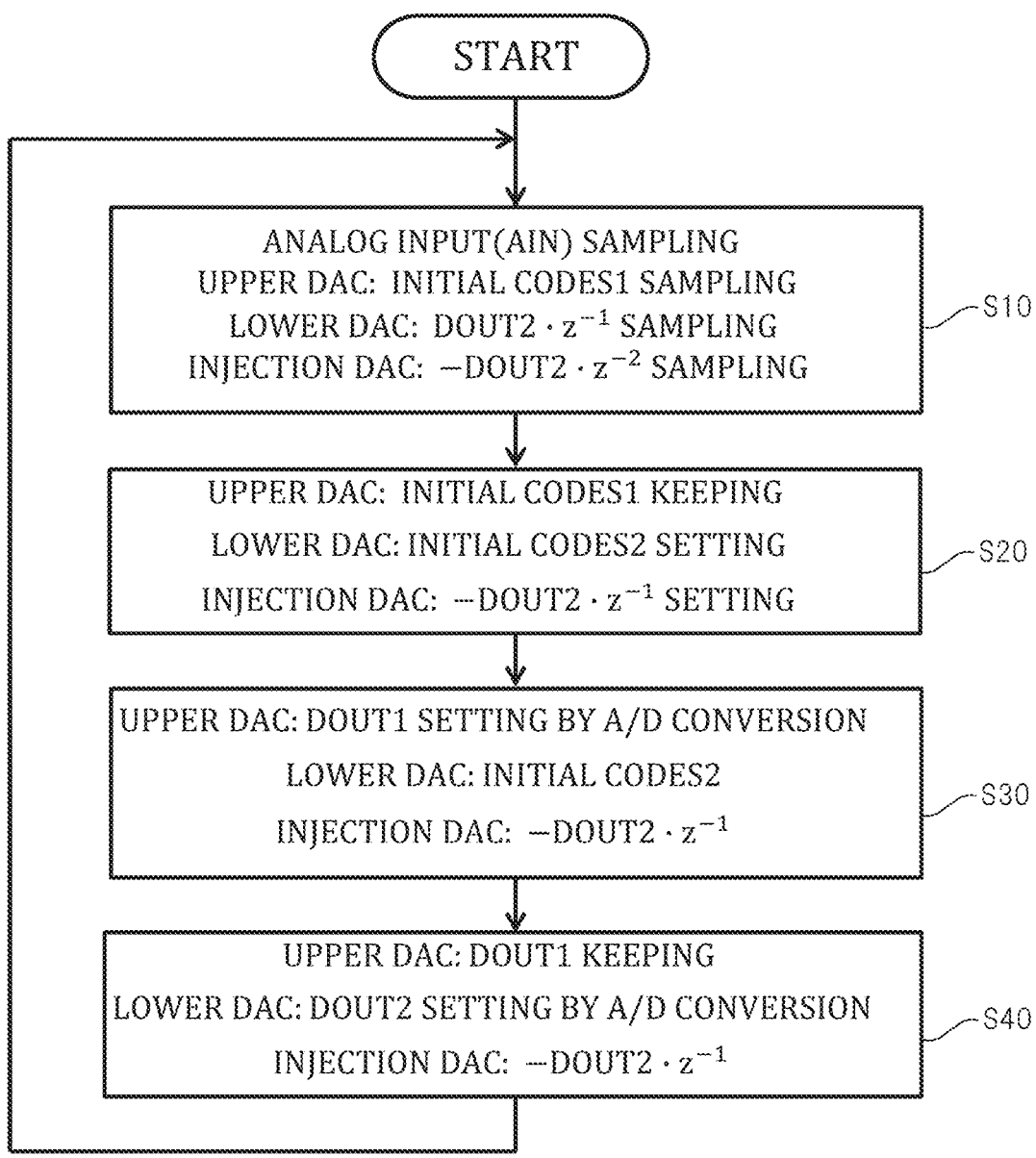
FIG. 2 is a flow chart showing an operation of an ADC according to the first embodiment of the present invention.

Next, an A/D conversion processing in the ADC 1 will be specifically described. FIG. 2 is a flow chart exemplifying an operation of the ADC according to the first embodiment of the present invention. FIG. 2 includes steps S10 to S40.

Figure 3:
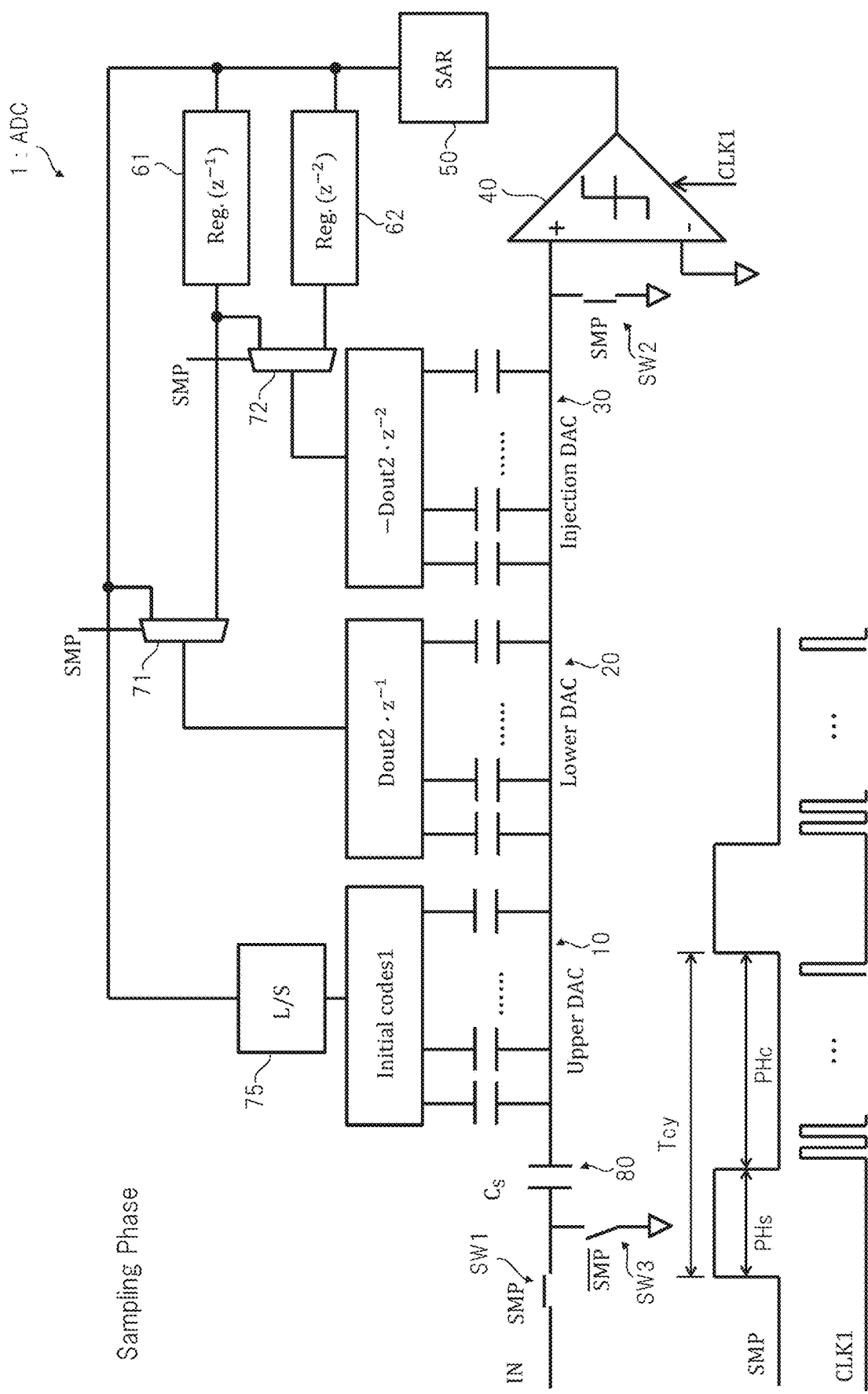
FIG. 3 is a view showing a setting status of each DAC in a sampling phase.

First, step S10 is a sampling phase in which input data is sampled. FIG. 3 is a view exemplifying a setting status of each DAC in the sampling phase. As shown in FIG. 3, a sampling signal SMP becomes active in a sampling phase PHs. At this time, a high-order bit (INITIAL CODES 1) of a predetermined initial code outputted from the sequential comparison processing unit 50 is set in the upper DAC 10.

The selector 71 selects the MES register 61. Consequently, a low-order bit (Dout2·$Z^{-1}$) of the one-previous digital code supplied from the MES register 61 is set in the lower DAC 20. The selector 72 selects the MES register 62. Consequently, an inversed code (−Dout2·$Z^{-2}$) of a low-order bit of a two-previous digital code is set in the injection DAC 30.

Then, in the sampling phase PHs, the switch circuits SW1 and SW2 are turned on, an analog input signal is supplied to the sampling capacity 80, and the sampling capacity 80 is charged. That is, the sampling capacity 80 is charged with the digital code set in each DAC.

When the sampling signal SMP becomes inactive, the sampling phase PHs ends.

Steps S20 to S40 are comparison phases PHc for comparing the reference voltage generated by each DAC with the analog input signal.

Figure 4:
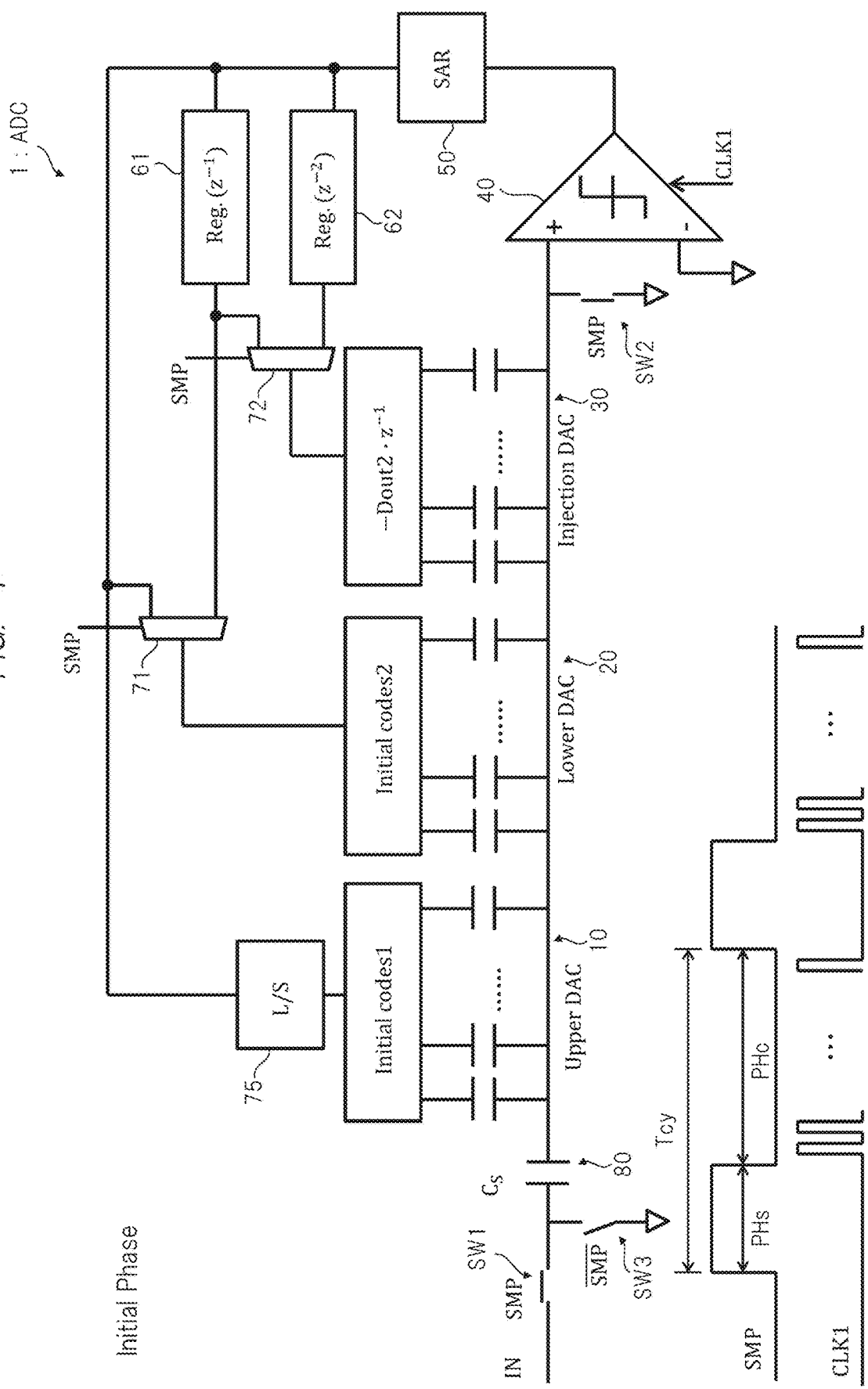
FIG. 4 is a view exemplifying a setting status of each DAC on an initial state of a comparison phase.

Step S20 is an initial state of the comparison phase. FIG. 4 is a view exemplifying a setting status of each DAC on an initial state of the comparison phase. As shown in FIG. 4, in the comparison phase PHc, the sampling signal SMP becomes inactive and a clock CLK1 is supplied to the comparator 40.

At this time, a state in which a high-order bit (INITIAL CODES 1) of the predetermined initial code is set in the upper DAC 10 is continued as it is in step S10.

The selector 71 selects the sequential comparison processing unit 50. Consequently, a low-order bit (INITIAL CODES 2) of the predetermined initial code supplied from the sequential comparison processing unit 50 is set in the lower DAC 20. The selector 72 selects the MES register 61.

Consequently, an inversion code (−Dout2·Z$^{-1}$) of a low-order bit of the one-previous digital code is set in the injection DAC 30. The reference voltage is generated by the analog input signal outputted from each DAC and supplied to the comparator 40.

Further, in the comparison phase PHc, the switch circuits SW1 and SW2 are turned off, and the switch circuit SW3 is turned on. Consequently, the analog input signal held in the sampling capacity 80 is supplied to the comparator 40 via the switch circuit SW2.

Step S30 is a first half of the comparison phase PHc, and a digital code is set for each bit of the upper DAC 10.

When the comparison processing by the comparator 40 is started, the sequential comparison processing unit 50 digitally converts the analog input signal based on the comparison result of the comparator 40 and sequentially generates a digital code (output data) from the highest-order bit. The generation of the digital code is executed, for example, by detecting an error (quantization error) generated when the analog input signal is digitally converted and A/D converting the detected quantization error.

The sequential comparison processing unit 50 outputs the generated digital code by one bit from aside of the high-order bits each time the sequential comparison is completed. Step S30 is executed until a digital code is supplied to each bit of the upper DAC 10. FIG. 2 shows a state in which a digital code is supplied to all the bits of the upper DAC 10. That is, at an end of step S30, the upper DAC 10 becomes a state in which the high-order bit of the digital data is set as shown in FIG. 2 (DOUT1).

Further, in step S30, as shown in FIG. 2, the digital data is not yet supplied to the lower DAC 20. Therefore, at an end of step S30, the lower DAC 20 is maintained in a state in which a low-order bit (INITIAL CODES 2) of the predetermined initial code is set. In addition, at the end of step S30, as shown in FIG. 2, the injection DAC 30 is maintained in a state in which an inversed code (−Dout2·Z$^{-1}$) of a low-order bit of the one-previous digital code is set.

Step S40 is a latter half of the comparison phase PHc, and a digital code is set for each bit of the lower DAC 20. The sequential comparison processing unit 50 continues to perform the sequential comparison based on the comparison result, and sequentially generates a digital code to be supplied to each bit of the lower DAC 20. The sequential comparison processing unit 50 sequentially outputs the generated digital code by one bit and supplies it to the lower DAC 20.

When the setting of the digital codes to the upper DAC 10 and the lower DAC 20 is completed, the comparison phase PHc ends.

Figure 5:
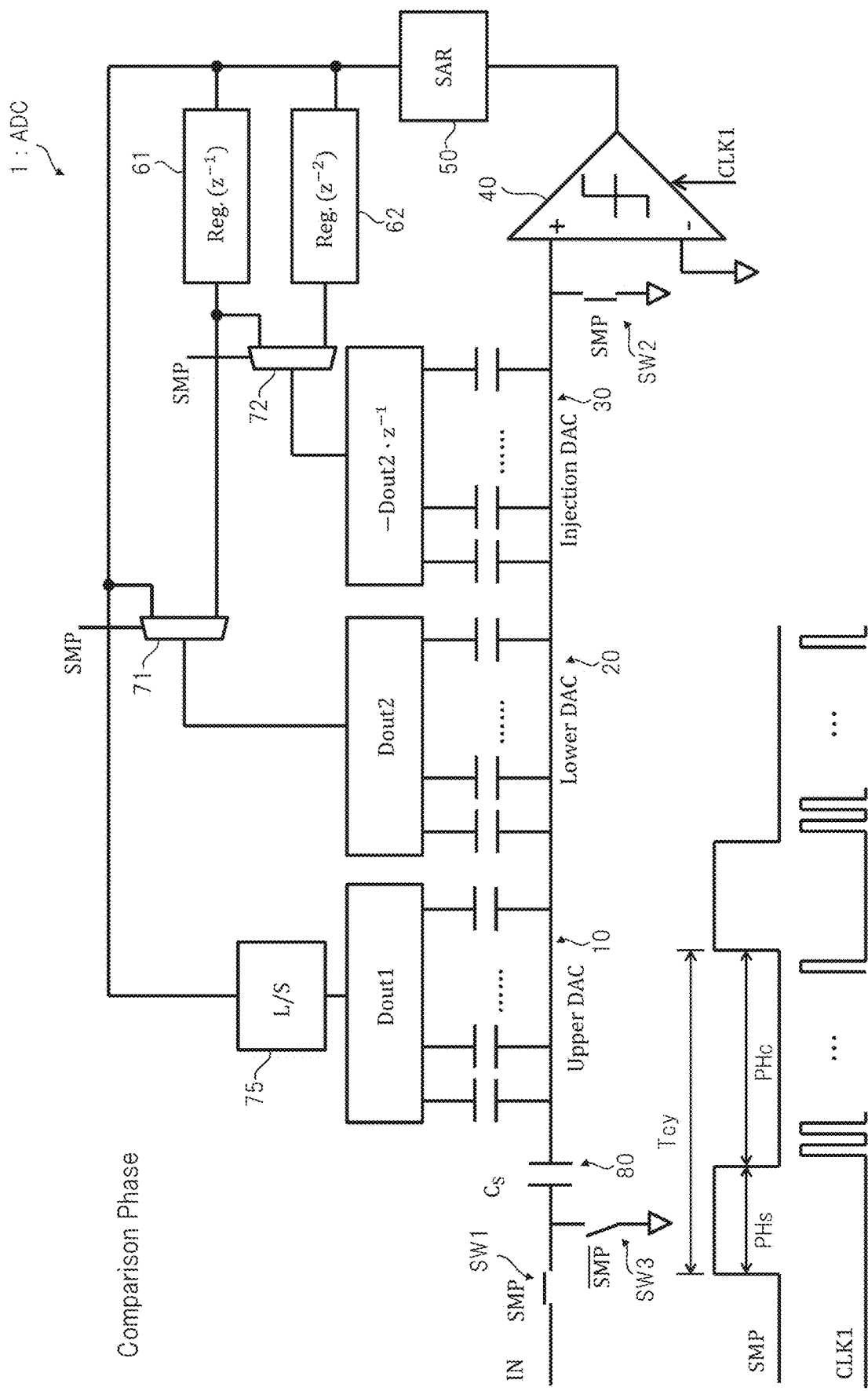
FIG. 5 is a view exemplifying a setting status of each DAC at an end of the comparison phase.

FIG. 5 is a view exemplifying a setting status of each DAC at an end of the comparison phase. At an end of step S40, the upper DAC 10 is maintained in a state (DOUT1) in which the high-order bit of the digital data is set as shown in FIG. 5. Further, at the end of step S40, the lower DAC 20 becomes a state (DOUT2) in which the low-order bit of the digital data is set as shown in FIG. 5. In addition, at the end of step S40, as shown in FIG. 5, the injection DAC 30 is maintained in a state in which the inversed code (−Dout2·Z$^{-1}$) of the low-order bit of the one-previous digital code is set.

In this way, the processing in one sampling cycle is performed. Then, the ADC 1 executes steps S10 to S40 also in the next sampling cycle Tcy, and continues to perform the digital conversion processing.

(Main Effects of Present Embodiment)

According to the present embodiment, the code written in the injection DAC 30 is set as the inversed code of the two-previous digital code in the sampling phase PHs, and the inverted code of the one-previous digital code in the comparison phase PHc. Consequently, capacity mismatch of the injection DAC is eliminated by first-order error shaping.

Further, in the sampling phase PHs, by writing the one-previous digital code into the lower DAC 20, a reference error between the upper DAC 10 operating at a high voltage and the lower DAC 20 operating at a low voltage is eliminated by second-order error shaping.

In addition, the capacity mismatch of the lower DAC 20 is eliminated by the first-order error shaping. This makes it possible to improve the conversion accuracy when the DACs different in operating voltage are used.

Furthermore, according to the present embodiment, a digital code that is offset by one time and inverted is written in the lower DAC 20 and the injection DAC 30. This configuration makes it possible to eliminate a settling error of the reference by the first-order error shaping.

Second Embodiment

Next, a second embodiment will be described. In the first embodiment described above, a low-voltage device cannot be used for the comparator 40 since a dynamic range of the output voltage of the DAC is large. Further, at a time of comparing the upper DAC 10, a level of the digital code needs to be level-shifted to a high voltage by the level shifter 75, so that there is a delay time of the level shifter 75.

Therefore, in the present embodiment, the comparison of the upper DAC 10 is performed by a sub ADC composed of a sub DAC and a comparator, and a comparison result of the sub ADC is used as a code of the upper DAC 10.

Figure 6:
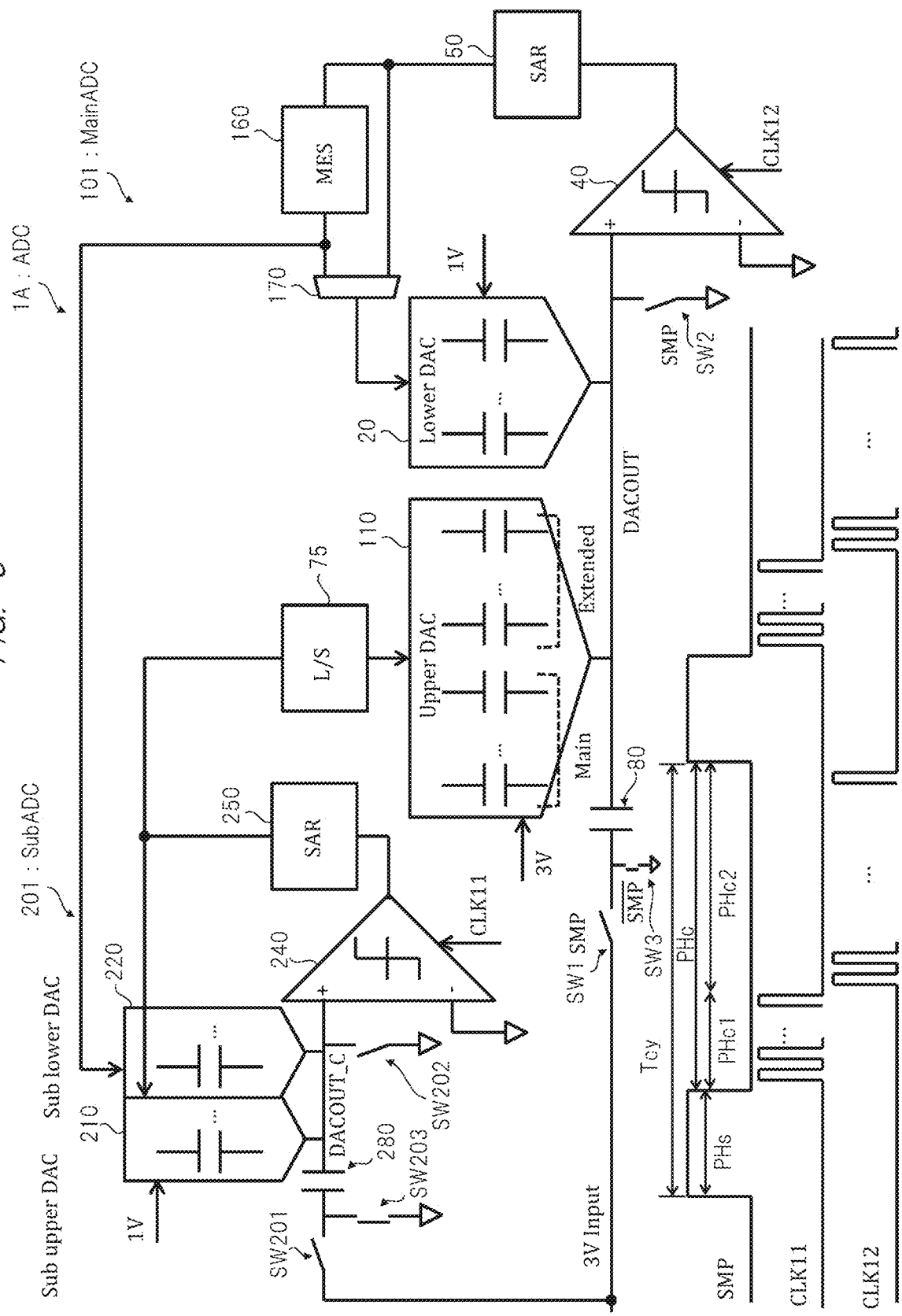
FIG. 6 is a configuration diagram showing an example of a semiconductor device according to a second embodiment of the present invention.

FIG. 6 is a configuration diagram showing an example of a semiconductor device according to a second embodiment of the present invention. An ADC 1A of FIG. 6 has a configuration in which a sub ADC 201 is added to a main ADC 101 similar to the ADC 1 of FIG. 1. (Main ADC)

As shown in FIG. 6, the main ADC 101 includes an upper DAC 10, a lower DAC 20, a comparator 40, a sequential comparison processing unit 50, a MES unit 160, a selector 170, a level shifter 75, sampling capacity 80, switch circuits SW1, SW2, and SW3, and the like.

The comparator 40 performs only comparison of a low-voltage region corresponding to the lower DAC 20 based on a clock CLK12 described later, and outputs a comparison result to the sequential comparison processing unit 50. In the present embodiment, the comparator 40 operates at a low voltage (for example, 1V).

The sequential comparison processing unit 50 performs digital conversion of the analog input signal by performing a sequential comparison processing based on the comparison result of the low-voltage region corresponding to the lower DAC 20 outputted from the comparator 40, and generates the low-order bit of the digital code. The low-order bit of the digital code generated by the sequential comparison processing unit 50 is outputted together with a high-order bit of the digital code generated by the sub ADC 201 described later. Furthermore, the low-order bit of the digital code is stored (saved) in the MES unit 160.

The MES unit 160 is configured by, for example, a MES register etc. as shown in FIG. 1. The MES unit 160 holds, for example, a digital code generated in the previous (one-previous) sampling cycle Tcy, a digital code generated in the current sampling cycle Tcy, and the like. The MES unit 160 outputs the digital code generated in the previous sampling cycle Tcy to the selector 170 and a sub lower DAC 220 described later.

The selector 170 is a circuit that switches the digital code (low-order bit) supplied to the lower DAC 20 based on the sampling signal SMP. An input side of the selector 170 is connected to the sequential comparison processing unit 50 and the MES unit 160. An output side of the selector 170 is connected to the lower DAC 20.

The high-order bit of the digital code outputted from the sub ADC 201, which will be described later, is supplied to the upper DAC 10 after being level-shifted to a high voltage by the level shifter 75. The upper DAC 10 is provided with an extended DAC (Extended) together with a main DAC (Main). This extended DAC is a DAC used to absorb the previous DAC output voltage injected into the lower DAC 20 by the MES unit 160.

(Sub ADC)

Next, a sub ADC 201A is a circuit that executes the comparison of the upper DAC 10 with a low-voltage reference and generates a high-order bit of the digital code. As shown in FIG. 6, the sub DAC 201 includes a sub upper DAC 210, a sub lower DAC 220, a comparator 240, a sequential comparison processing unit 250, sampling capacity 280, switch circuits SW201, SW202, SW203, and the like.

The sub upper DAC 210 is a DAC corresponding to the upper DAC 110. The sub lower DAC 220 is a DAC corresponding to the lower DAC 20. The sub upper DAC 210 and the sub lower DAC 220 operate at a low voltage (for example, 1 V). The sub upper DAC 210 is provided with an extended DAC (not shown) together with the main DAC. This extended DAC is a DAC used to absorb the previous DAC output voltage injected into the sub lower DAC 220 by the MES unit 160.

Incidentally, the sub ADC 201 may be configured not to have a sub lower DAC. In this case, it may not be provided with the extended DAC of the sub upper DAC 210. This makes it possible to simplify a circuit configuration of the sub ADC 201.

The comparator 240 performs only comparison of a high-voltage region corresponding to the upper DAC 110 based on a clock CLK11 described later, and outputs a comparison result to the sequential comparison processing unit 250. The comparator 240 operates at a low voltage (for example, 1 V).

The sequential comparison processing unit 250 performs digital conversion of the analog input signal by performing the sequential comparison processing based on a comparison result of a high-voltage region corresponding to the sub upper DAC 210 outputted from the comparator 240, and generates a high-order bit of the digital code. The high-order bit of the digital code generated by the sequential comparison processing unit 250 is outputted together with a low-order bit of the digital code generated by the main ADC 101. Further, the high-order bit of the digital code is supplied to the sub upper DAC 210. Furthermore, the high-order bit of the digital code is supplied to the upper DAC 110 via the level shifter 75.

The switch circuits SW201 to SW203 correspond to the switch circuits SW1 to SW3 of the main ADC 101, respectively. The sampling capacity 280 corresponds to the sampling capacity 80 of the main ADC.

(A/D Conversion Processing)

Next, an A/D conversion processing of an ADC 1A will be specifically described. In the sampling phase PHs, the analog input signal is held in the sampling capacity 80 and 280.

As shown in FIG. 6, the comparison phase PHc includes a first comparison phase PHc1 that generates a high-order bit of the digital code in the sub ADC 201, and a second comparison phase PHc2 that generates a low-order bit of the digital code in the main ADC 101.

In the first comparison phase PHc1, the clock CLK11 is supplied to the comparator 240, and a digital conversion processing of the high-order bit for the analog input signal is performed. The sequential comparison processing unit 250 sequentially generates a digital code from the highest-order bit, and outputs a digital code of each generated bit to the sub upper DAC 210 and the upper DAC 110.

When the digital conversion processing of the high-order bit for the analog input signal is completed, the supply of the clock CLK11 is stopped and the first comparison phase PHc1 ends.

Next, in the second comparison phase PHc2, a clock CLK12 is supplied to the comparator 40, and a digital conversion processing of the low-order bit for the analog input signal is performed. The sequential comparison processing unit 50 sequentially generates a digital code from the highest-order bit of the lower DAC 20, outputs a digital code of each generated bit, and causes the MES unit 160 to hold the outputted digital code.

When the digital conversion processing of the low-order bit for the analog input signal is completed, the supply of the clock CLK12 is stopped and the second comparison phase PHc2 ends. Consequently, the comparison phase PHc ends.

In this way, the processing in one sampling cycle is performed. Then, the ADC 1A executes steps S10 to S40 also in the next sampling cycle Tcy, and continues to perform the digital conversion processing.

Figure 7:
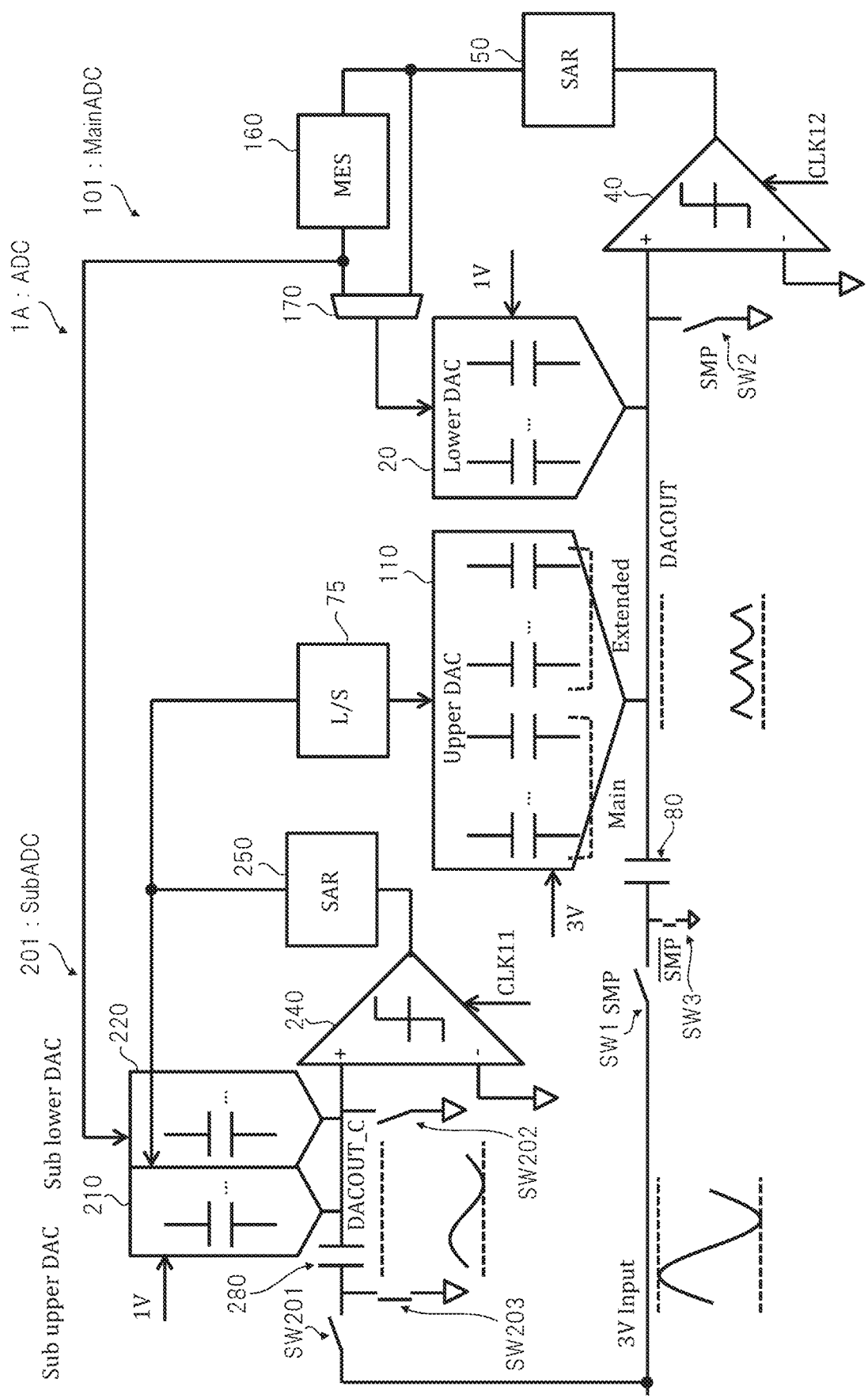
FIG. 7 is a view showing comparison of output voltages of each DAC in a comparison phase of the second embodiment of the present invention.

FIG. 7 is a view showing comparison of output voltages of respective DACs in a comparison phase of the second embodiment of the present invention. First, in the first comparison phase PHc1, a voltage (DACOUT_C) outputted from the sub upper DAC 210 becomes a low voltage. In this way, in the sub ADC 201, an input signal of a high voltage (for example, 3 V) is digitally converted by the reference of the low voltage, and a high-order bit of the digital code is generated.

Further, in the second comparison phase PHc2, since the digital conversion processing of the low-order bit corresponding to the low-voltage region is performed in the main ADC 101, a voltage (DACOUT) outputted from the lower DAC 20 is a low voltage as shown in FIG. 7. In the main ADC 101, the digital conversion to the input signal of the low voltage corresponding to the low-order bit of the digital code is performed by the reference of the low voltage, and a low-order bit of the digital code is generated.

(Transfer Function)

Figure 8:
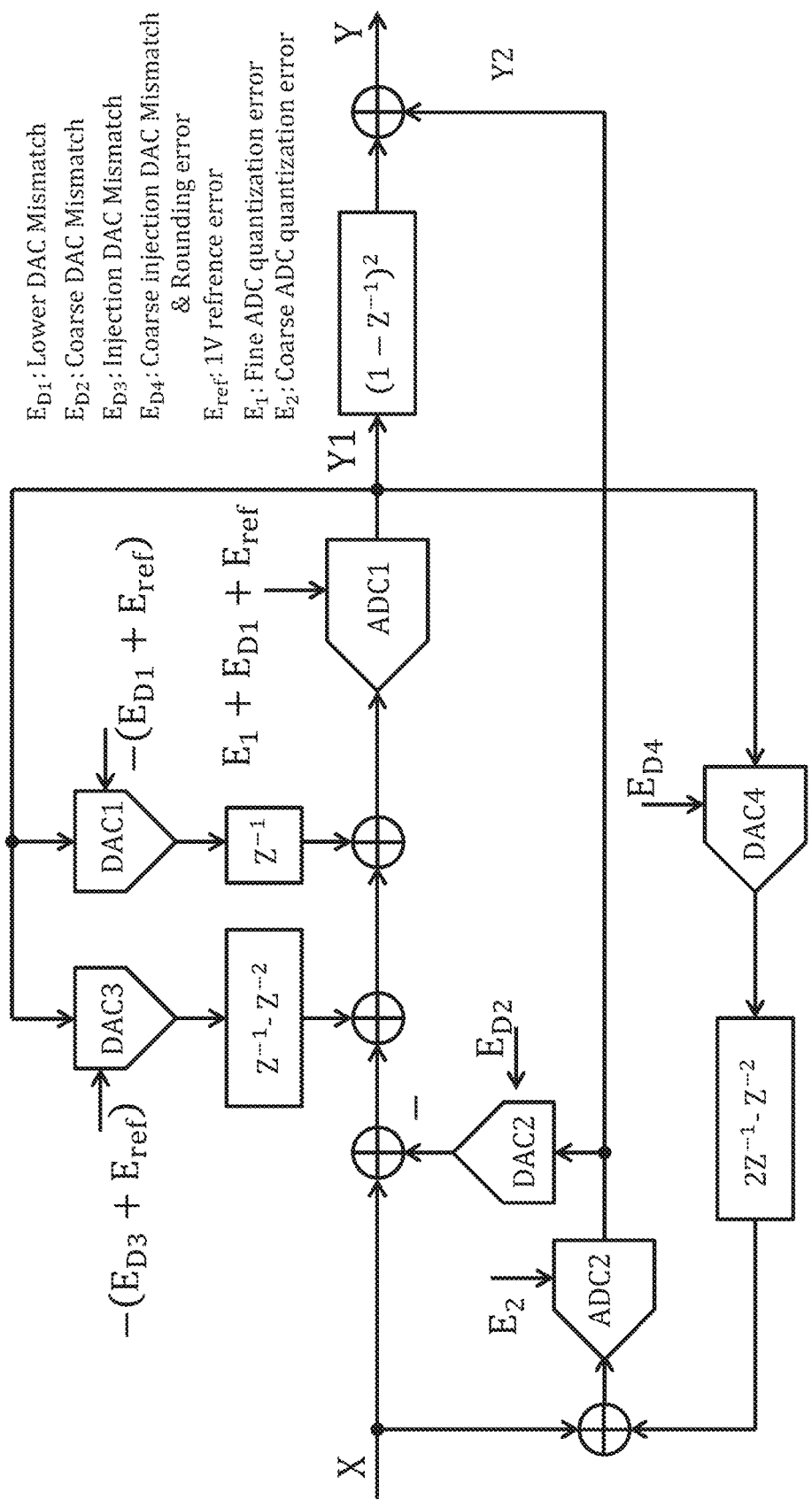
FIG. 8 is a view showing a transfer function and a system configuration including an ADC according to the second embodiment of the present invention.

FIG. 8 is a view exemplifying a system configuration including the ADC according to the second embodiment of the present invention and a transfer function. In the system configuration shown in FIG. 8, if it is assumed that an input is "X" and an output is "Y", a transfer function is represented by equations (1) to (3) in FIG. 8. "$(E_{D1}-z^{-1}E_{D3})(1-z^{-1})$" and "$E_{ref}(1-z^{-1})^2$" in equation (3) among these equations correspond to "DAC 4" and "$2\ Z^{-1}-Z^{-2}$" in FIG. 8. Then, these correspond to the lower DAC 20 and the sub lower DAC 220 in FIG. 6.

In this way, providing the sub ADC 201 with the sub lower DAC 220 makes it possible to improve replica accuracy of the sub ADC 201.

(Main Effects of Present Embodiment)

According to the present embodiment, the sub ADC 201 that digitally converts the high-order bit and the main ADC 101 that digitally converts the low-order bit are independent. This configuration makes it possible to attenuate the dynamic range of the comparator 240 of the sub ADC 201 up to a withstand voltage of the low-withstand-voltage device.

Consequently, the sub upper DAC 210 can be driven with the reference of the low voltage. Thus, the sub ADC 201 can be configured only by the low-withstand-voltage device. Further, in the sub ADC 201, the level shift does not need to be performed in supplying the digital code to the sub upper DAC 210. This makes it possible to speed up the comparison processing.

The sub ADC 201 has a relatively large error, but this error is suppressed by redundancy of the lower DAC 20 of the main ADC 101. Further, since the sub lower DAC 220 performs a MES operation as a replica of the lower DAC 20 of the main ADC 101, the error of the sub ADC 201 can be reduced.

Further, according to the present embodiment, since the main ADC 101 is compared from the lower DAC 20, the dynamic range of the comparator 40 can be reduced and the comparator 40 can be configured only by the low-withstand-voltage device.

Third Embodiment

Next, a third embodiment will be described. The present embodiment is configured so that the reference voltage supplied to the upper DAC 110 of the ADC 1A in the second embodiment is switched between a high voltage (for example, 3V) and a low voltage (for example, 1V).

Figure 9:
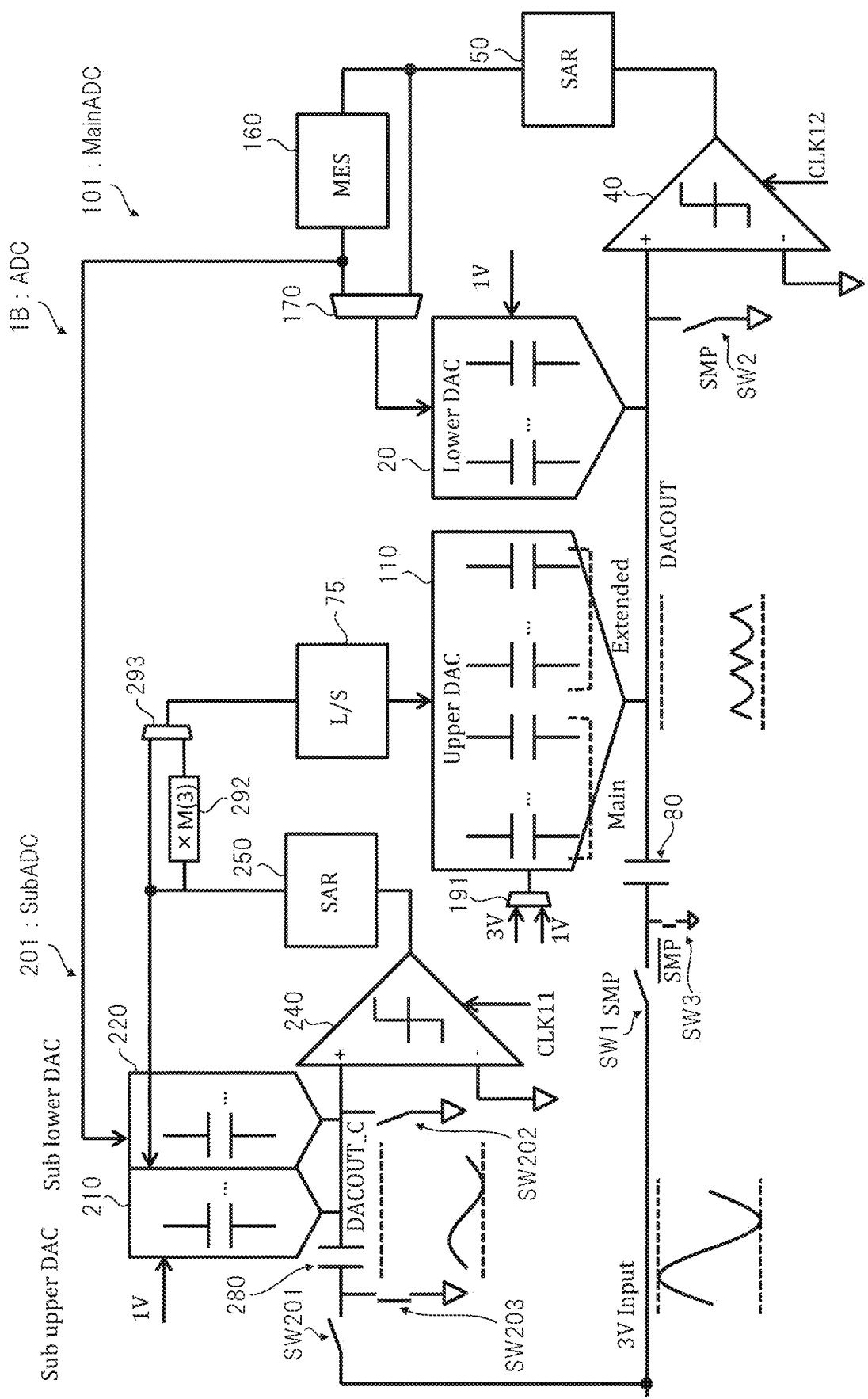
FIG. 9 is a configuration diagram showing an example of a semiconductor device according to a third embodiment of the present invention.

FIG. 9 is a configuration diagram showing an example of a semiconductor device according to a third embodiment of the present invention. An ADC 1B of FIG. 9 has a configuration in which a selector 191, a digital multiplication circuit 292, and a selector 293 are added to the ADC 1A of FIG. 6.

In the digital multiplication circuit 292, its input side is connected to the sequential comparison processing unit 250, and its output side is connected to the selector 293. The digital multiplication circuit 292 is a circuit that generates a multiplication digital code by digitally multiplying output data (digital code) of the sequential comparison processing unit 250 at a predetermined magnification (for example, 3 times). The digital multiplication circuit 292 outputs the generated multiplication digital code.

The selector 293 is a circuit for switching the digital code supplied to the upper DAC 110 of the main ADC 101. The digital code supplied to the upper DAC 110 of the main ADC 101 is switched according to a voltage value corresponding to the output data.

For example, if the voltage value corresponding to the output data is a high voltage, the selector 293 selects and outputs a digital code that is not multiplied and is outputted from the sequential comparison processing unit 250. Meanwhile, if the voltage value corresponding to the output data is a low voltage, the selector 293 selects and outputs the multiplication digital code outputted from the digital multiplication circuit 292. The digital code selected by the selector 293 is supplied to the upper DAC 110 after a voltage level is shifted by the level shifter 75.

The selector 191 is a circuit that switches the reference voltage supplied to the upper DAC 110. The reference voltage supplied to the upper DAC 110 is switched according to conversion accuracy required for the digital conversion of the analog input signal.

For example, when the conversion accuracy is required with medium accuracy, the selector 191 selects and outputs a low-voltage reference. In this case, the upper DAC 110 and the lower DAC 20 are supplied with a reference having the same potential.

Meanwhile, when the conversion accuracy is required with high accuracy, the selector 191 selects and outputs a high-voltage reference. The reference selected by the selector 293 is supplied to the upper DAC 110. In this case, as in the first embodiment, the upper DAC 110 is supplied with the high-voltage reference, and the lower DAC 20 is supplied with the low-voltage reference.

According to the present embodiment, when the conversion accuracy is required with the medium accuracy, the reference of the same voltage is supplied to the upper DAC 110 and the lower DAC 20, which makes it possible to perform the digital conversion at a high speed. Meanwhile, when the conversion accuracy is required with the high accuracy, the high-voltage reference is supplied to the upper DAC 110 and the low-voltage reference is supplied to the lower DAC 20, which makes it possible to improve the accuracy of the digital conversion. In this way, it becomes possible to give one ADC 1B contradictory features of improving the speed and the accuracy of the digital conversion.

Fourth Embodiment

Next, a fourth embodiment will be described. In the present embodiment, a multi-channel ADC system using the ADC according to the above-described embodiment will be described. Such a multi-channel ADC system is installed in, for example, an MCU (Memory Control Unit), a SoC (System-on-a-chip), or the like.

Figure 10A:
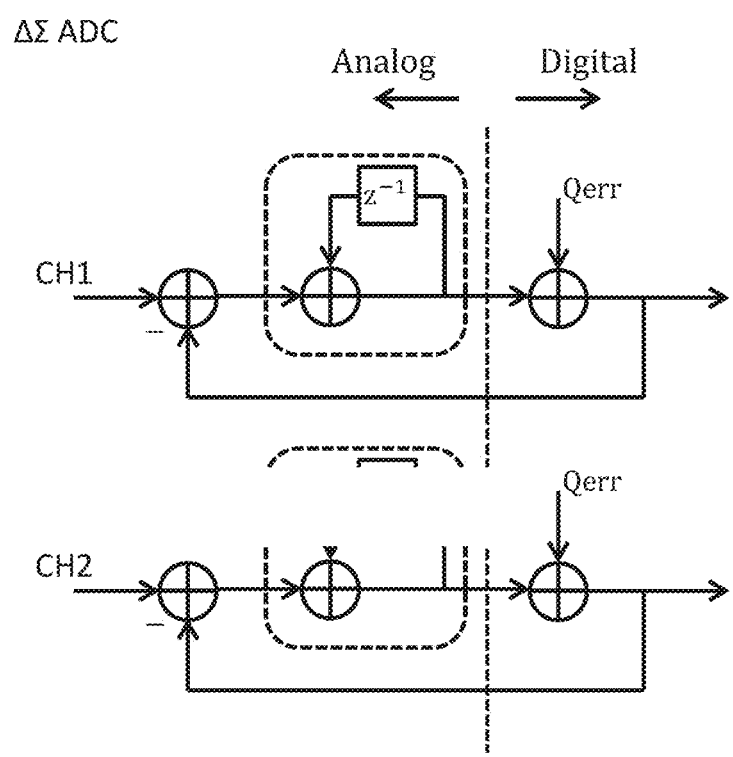
FIG. 10A is a diagram for explaining a conventional $\Delta\Sigma$ ADC.
Figure 10B:
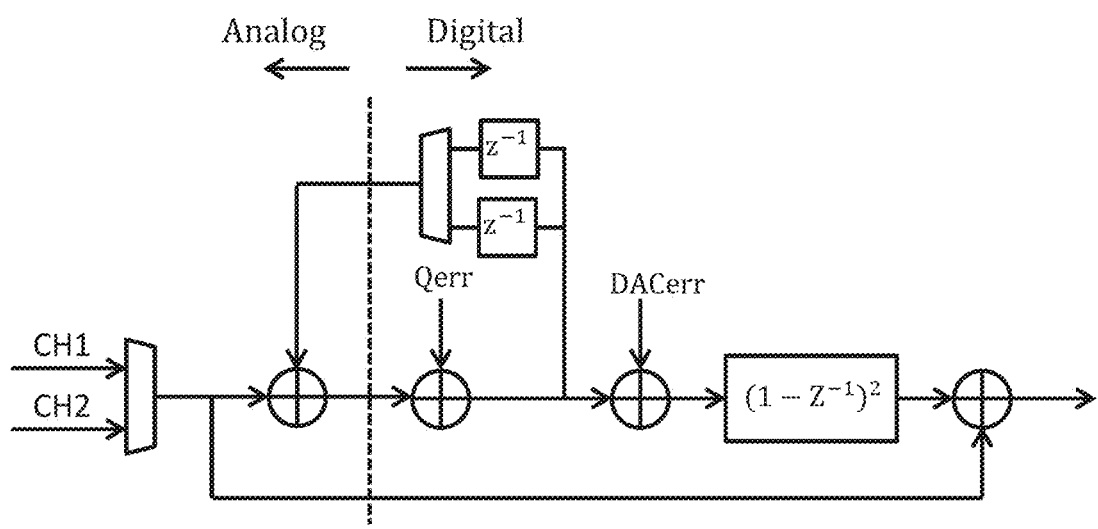
FIG. 10B is a diagram for explaining a base ADC that is a base of a multi-channel ADC system according to a fourth embodiment of the present invention.

First, the ADC that is a base of the multi-channel ADC system of the present embodiment will be described. FIG. 10 is a diagram for explaining an ADC that is a base of a multi-channel ADC system according to a fourth embodiment of the present invention. FIG. 10A shows a conventional ΔΣ ADC and FIG. 10B shows a base ADC.

In the conventional ΔΣ ADC, since integration of each input signal by a common analog integrator brings interference between channels, a ΔΣ ADC needs to be provided for each channel. Meanwhile, since a DAC type integrator is used in the ADC (hereinafter, also referred to as Hybrid ADC) according to each of the above-described embodiments, output data of the integrator can be handled in a digital region. In a Hybrid ADC, the interference between the channels can be prevented by preparing a register for integration data for each channel.

Figure 11A:
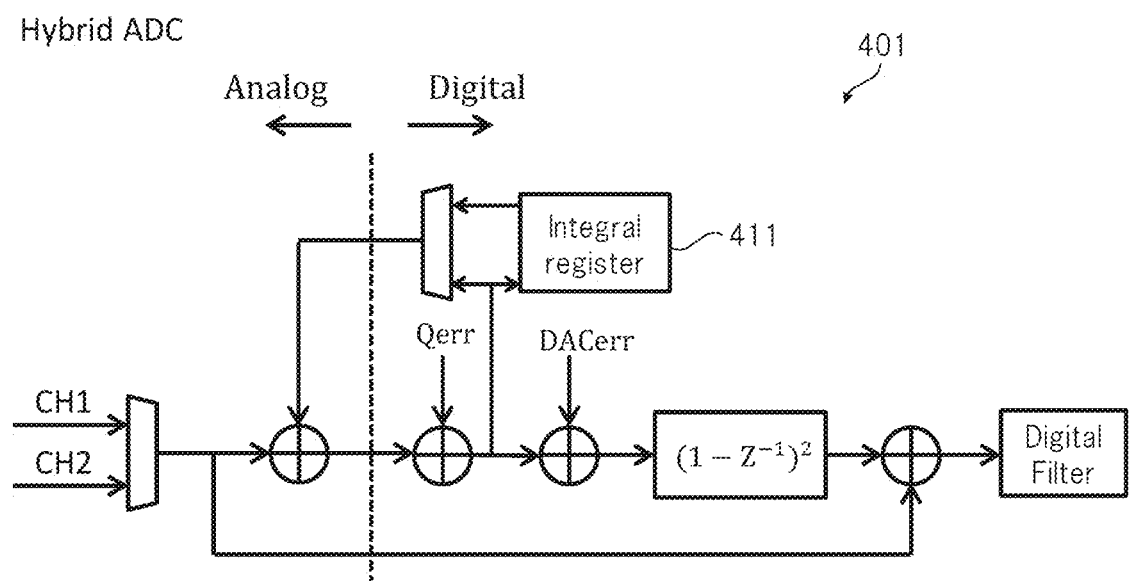
FIG. 11A is a view exemplifying a configuration of 2 inputs and 1 output multi-channel ADC system according to the fourth embodiment of the present invention.

FIG. 11 is a view exemplifying a configuration of a multi-channel ADC system according to a fourth embodiment of the present invention. FIG. 11A shows a multi-channel ADC system 401 with 2 inputs and 1 output. The multi-channel ADC system 401 is provided with a selector for selecting an input channel. Therefore, the multi-channel ADC system 401 is provided with one integral register 411 corresponding to one input. Incidentally, the multi-channel ADC system 401 may be provided with two integral registers corresponding to each of the two channels.

Figure 11B:
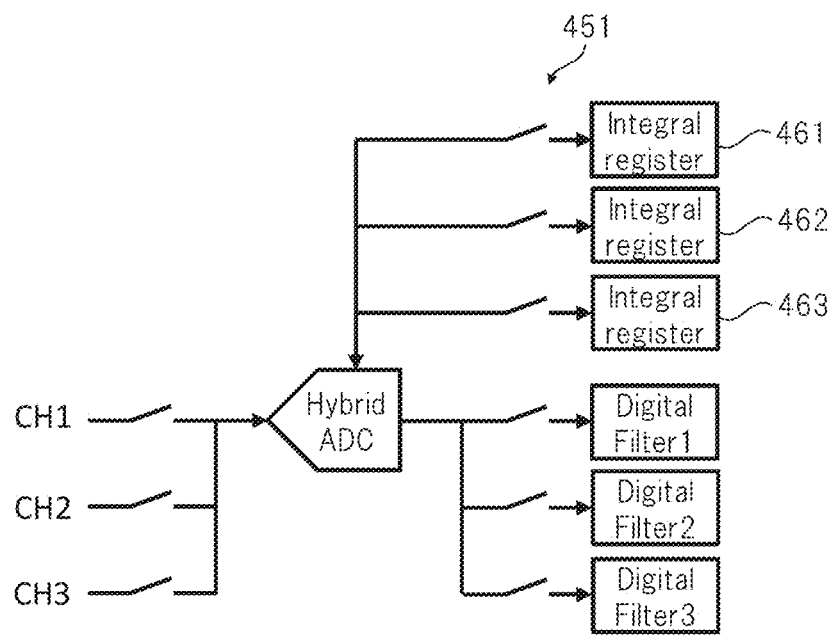
FIG. 11B is a view exemplifying a configuration of 3 inputs and 3 outputs multi-channel ADC system according to the fourth embodiment of the present invention.

FIG. 11B shows a multi-channel ADC system 451 with 3 inputs and 3 outputs. In a configuration of FIG. 11B, A/D conversion is performed for a plurality of input channels in parallel. Therefore, the multi-channel ADC system 451 is provided with three integral registers 461 to 463 corresponding to each channel of the three inputs.

According to the present embodiment, each analog input signal of the plurality of channels can be digitally converted by one ADC. Consequently, an area of the ADC can be reduced as compared with the ΔΣ ADC. Further, since an amount of data in the integral register is small, an area of the integral register can be suppressed and an increase in power consumption can be suppressed.

Fifth Embodiment

Next, a fifth embodiment will be described. In the present embodiment, a method of executing sampling of a plurality of channels in parallel in a multi-channel ADC system will be described.

Figure 12A:
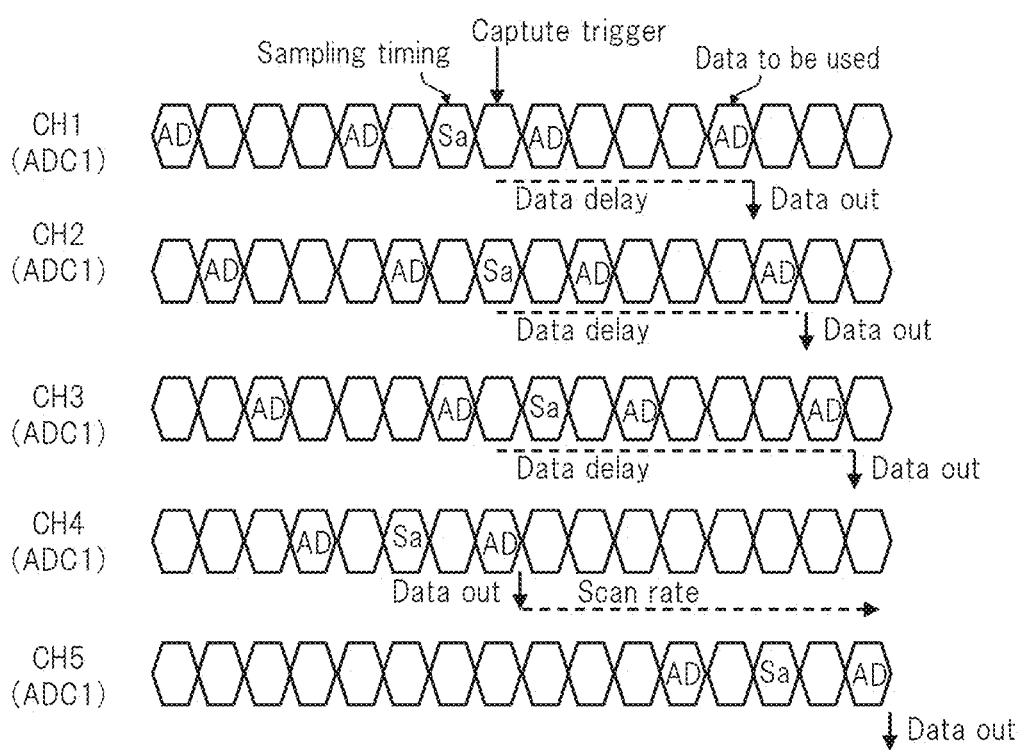
FIG. 12A is a timing chart for explaining a sampling method according to a fifth embodiment of the present invention.
Figure 12B:
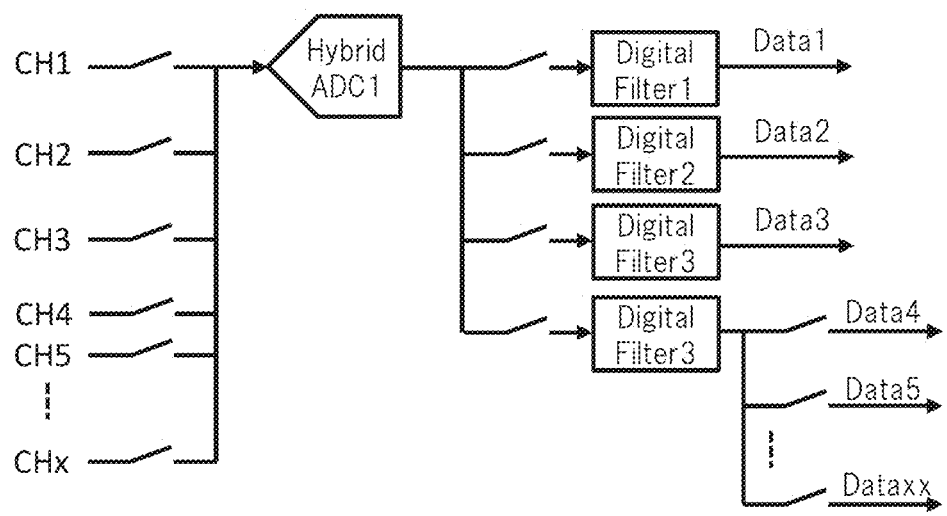
FIG. 12B is a block diagram for explaining a sampling method according to the fifth embodiment of the present invention.

FIG. 12 is a diagram for explaining a sampling method according to a fifth embodiment of the present invention. FIG. 12 shows an example in which sampling of 5 channels (CH1 to CH5) is executed in parallel. Here, it is assumed that CH1 to CH3 are sampled in an oversampling mode and CH4 to CH5 are sampled in a Nyquist mode. In the oversampling mode, the sampling needs to be performed periodically, whereas in the Nyquist mode, the sampling may be performed intermittently as needed.

In this example, four A/D conversion sequences (corresponding to four blocks in FIG. 12) are handled as one group. First to third A/D conversions are assigned to the channels (CH1 to CH3) in the oversampling mode, and a fourth A/D conversion is assigned to the CH (CH4 or CH5) in the Nyquist mode. That is, the A/D conversion in the Nyquist mode is assigned between the A/D conversions in the oversampling mode.

The A/D conversion in the oversampling mode requires a large initial delay to obtain a normal output result. This is because a lot of A/D conversions is required to fill all taps of a digital filter. Conventionally, waiting for the large initial delay has been required each time the channel is switched.

In contrast, in the present embodiment, since the A/D conversion is always continuously executed, a waiting time for an initial response does not occur. Further, the A/D converter operating in the Nyquist mode is required to operate intermittently as needed. However, by assigning the channels as shown in FIG. 12, a system that realizes such an operation can be constructed.

In the foregoing, the invention made by the inventors of the present invention has been specifically described based on the embodiments. However, it is needless to say that the present invention is not limited to the foregoing embodiments and various modifications and alterations can be made without departing from the scope of the present invention.

What is claimed is:

1. A semiconductor device performing sequential comparison of an analog input signal and a reference voltage to digitally convert the analog input signal, the semiconductor device comprising:
   an upper DAC generating a high-voltage region of the reference voltage based on a predetermined code;
   a lower DAC generating a low-voltage region of the reference voltage based on the predetermined code; and
   an injection DAC having a same configuration as that of the lower DAC and adjusting the low-voltage region of the reference voltage,
   wherein a sampling phase that samples the analog input signal is configured to:
      supply a high-order bit of an initial code to the upper DAC;
      supply a low-order bit of one-previous output data to the lower DAC; and
      supply, to the injection DAC, a low-order bit of inverted data obtained by inverting two-previous output data.

2. The semiconductor device according to claim 1,
   wherein, at a start of a comparison phase that compares the analog input signal sampled in the sampling phase with the reference voltage,
   wherein the high-order bit of the initial code is supplied to the upper DAC,
   wherein a low-order bit of the initial code is supplied to the lower DAC, and
   wherein a low-order bit of inverted data obtained by inverting one-previous output data is supplied to the injection DAC.

3. The semiconductor device according to claim 2,
   wherein, at an end of comparison of a high-order bit in the comparison phase,
   wherein a high-order bit of current output data is supplied to the upper DAC,
   wherein a low-order bit of the initial code is supplied to the lower DAC, and
   wherein a low-order bit of inverted data obtained by inverting the one-previous output data is supplied to the injection DAC.

4. The semiconductor device according to claim 3,
   wherein, at an end of the comparison phase,
   wherein a high-order bit of current output data is supplied to the upper DAC,
   wherein a low-order bit of the current output data is supplied to the lower DAC, and
   wherein a low-order bit of inverted data obtained by inverting the one-previous output data is supplied to the injection DAC.

5. A semiconductor device performing sequential comparison of an analog input signal and a reference voltage to digitally convert the analog input signal, the semiconductor device comprising:
   a main ADC digitally converting a low-voltage region of the analog input signal; and
   a sub ADC digitally converting a high-voltage region of the analog input signal,
   wherein the main ADC includes:
      an upper DAC generating a high-voltage region of the reference voltage based on a predetermined code; and
      a lower DAC generating a low-voltage region of the reference voltage based on the code,
   wherein the sub ADC includes:
      a sub upper DAC generating a high-voltage region of the reference voltage based on a predetermined code; and
      a sub lower DAC generating a low-voltage region of the reference voltage based on the code,
   wherein the sub upper DAC operates at a low-voltage reference, and
   wherein output data of the sub DAC is supplied to the upper DAC.

6. The semiconductor device according to claim 5,
   wherein a low-voltage reference is supplied to the upper DAC when digital conversion of the analog input signal is performed with middle accuracy, and
   wherein a high-voltage reference is supplied to the upper DAC when digital conversion of the analog input signal is performed with high accuracy.

7. The semiconductor device according to claim 5, further comprising a digital multiplication circuit digitally multiplying output data of the sub DAC by a predetermined value, wherein the output data and the digitally multiplied output data are supplied to the upper DAC.

* * * * *